(12) United States Patent
Jan

(10) Patent No.: US 7,898,350 B2
(45) Date of Patent: Mar. 1, 2011

(54) FREQUENCY STABILIZING DEVICE OF AN OSCILLATOR

(75) Inventor: Shiun-Dian Jan, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 0 days.

(21) Appl. No.: 12/147,085

(22) Filed: Jun. 26, 2008

(65) Prior Publication Data

US 2009/0096542 A1    Apr. 16, 2009

(30) Foreign Application Priority Data

Jul. 6, 2007  (TW) ............................... 96124640 A

(51) Int. Cl.
*H03L 5/02*  (2006.01)
(52) U.S. Cl. .................... 331/185; 331/57; 331/175
(58) Field of Classification Search .................. 331/57, 331/175, 185

See application file for complete search history.

(56) References Cited

U.S. PATENT DOCUMENTS 6,127,898 A * 10/2000 Naura .......................... 331/57
6,909,335 B2 * 6/2005 Bae ............................ 331/135
7,449,965 B2 * 11/2008 Jang ............................ 331/57

* cited by examiner

*Primary Examiner*—Robert Pascal
*Assistant Examiner*—James E Goodley
(74) *Attorney, Agent, or Firm*—Muncy, Geissler, Olds & Lowe, PLLC

(57) ABSTRACT

A frequency stabilizing device of an oscillator is disclosed. The frequency stabilizing device of an oscillator is used for stabilizing the frequency of an oscillator to keep the frequency in constant when input voltage is changed. The frequency stabilizing device comprises a plurality of transmission gates for receiving an input voltage and generating a current and a plurality of resistors for control the value of the current, wherein the current is positive in relation to the input voltage and the frequency of the oscillator is determined by the current.

16 Claims, 2 Drawing Sheets

FREQUENCY STABILIZING DEVICE OF AN OSCILLATOR

BACKGROUND OF THE INVENTION

1. Field of the Invention

The invention relates generally to a frequency stabilizing device of an oscillator and, more particularly, to a frequency stabilizing device in the application of an RC oscillator.

2. Description of the Related Art

An oscillator is an electrical circuit for generating a periodic signal, such as a sine wave or a square wave, which is divided into two groups: a harmonic oscillator and a relaxation oscillator. An RC oscillator is a harmonic oscillator, and only includes resistors and capacitors in the oscillation circuitry, without the use of inductors.

Typically, variations in the frequency of an RC oscillator are determined by the value of voltage. Please refer to FIG. 1. FIG. 1 illustrates variations in the frequency of oscillators related to different input voltages. A high voltage waveform 11 shows the waveform of the oscillator with a predetermined voltage. When the voltage of the oscillator decreases, the waveform becomes a low voltage waveform 12. Here, the frequency increases due to the amplitude of the low voltage waveform 12 being smaller than that of the high voltage waveform 11. Accordingly, the oscillator then generates more waveforms over a same period.

However, since the frequency of an oscillator is generally related to an input voltage, variations in the voltage of an oscillator causes variations in the frequency of the oscillator and results in circuit errors. Therefore, it is desirable to provide a frequency stabilizing device of an oscillator.

BRIEF SUMMARY OF THE INVENTION

Accordingly, it is an object of the invention to provide a frequency stabilizing device of an oscillator for stabilizing the frequency of an oscillator to keep the frequency in constant when an input voltage is changed. In order to accomplish the above object, the frequency stabilizing device of an oscillator according to one embodiment of the invention comprises a plurality of gate elements comprising a plurality of MOS; a plurality of voltage sources coupled to the plurality of gate elements as the input voltage of the plurality of gate elements; and a plurality of resistors coupled to the plurality of gate elements coupled to voltage sources to generate a current which is positive in relation to the input voltage.

According to another embodiment of the invention, a frequency stabilizing device of an oscillator for stabilizing the frequency of an oscillator to keep the frequency in constant when an input voltage is changed is provided. The frequency stabilizing device of an oscillator comprises a plurality of gate elements comprising a plurality of MOS; a plurality of voltage sources coupled to the plurality of gate elements as the input voltage of the plurality of gate elements; and a plurality of resistors coupled to the plurality of gate elements coupled to the voltage source to generate a current which is positive in relation to the input voltage.

According to still another embodiment of the invention, an oscillator comprising a frequency stabilizing device for stabilizing the frequency of an oscillator and reducing variations in the oscillator when an input voltage of the oscillator is changed is provided. The frequency stabilizing device comprises a plurality of transmission gates for receiving the input voltage to generate a current and a plurality of resistors for controlling the value of the current which controls the frequency of the oscillator which is positive in relation to the input voltage.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
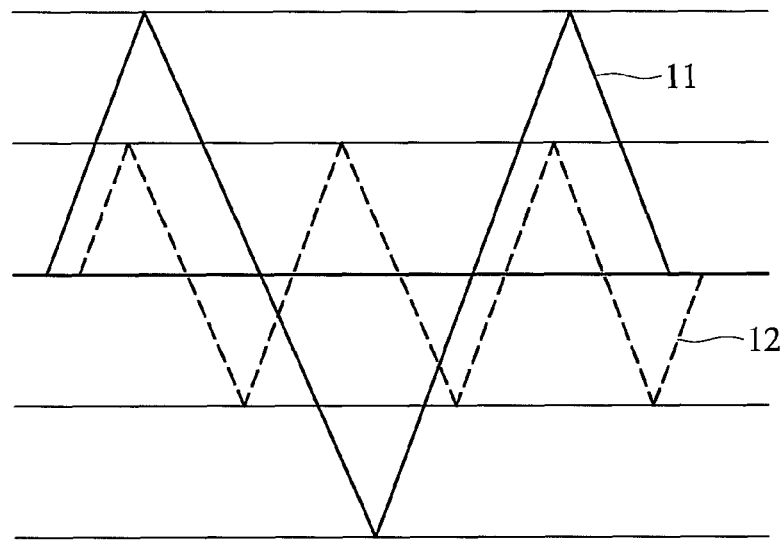
FIG. 1 illustrates variations in the frequency of oscillators related to different input voltages.
Figure 2:
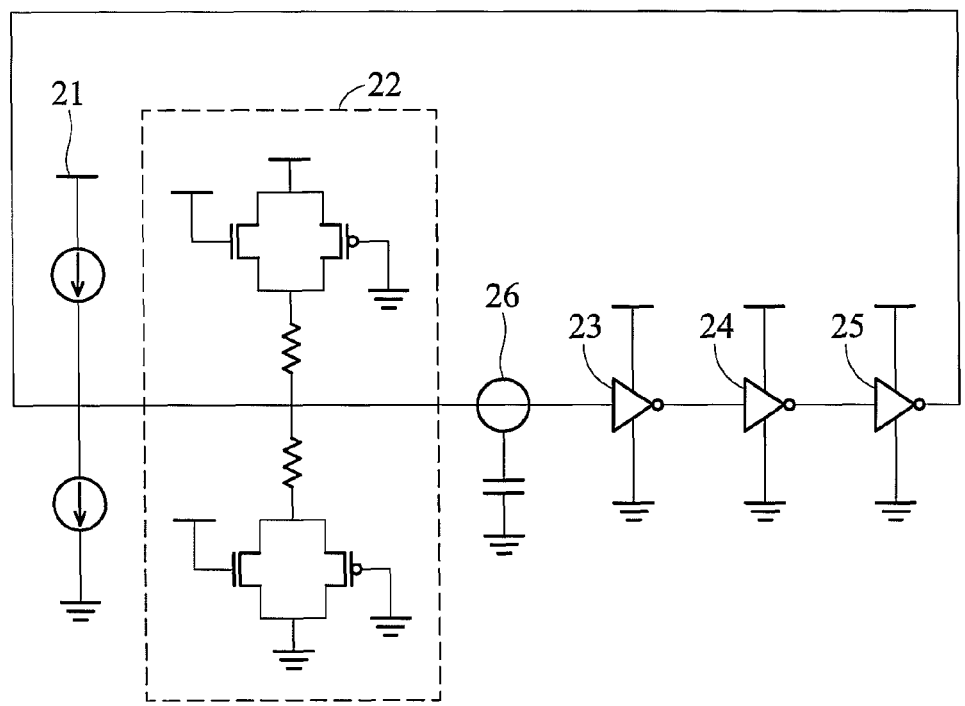
FIG. 2 illustrates an oscillator circuit according to a preferred embodiment of the invention.

Please refer to FIG. 2. FIG. 2 illustrates an oscillator circuit according to a preferred embodiment of the invention. As shown in FIG. 2, the oscillator circuit 2 comprises a voltage source 21, a frequency stabilizing device 22, comparators 23, 24 and 25, and a capacitor 26. The voltage source 21 supplies an input voltage to the oscillator circuit 2 for generating a sine wave. The stabilizing device 22 is coupled between the voltage source 21 and the capacitor 26 for generating the current corresponding to the input voltage supplied by the voltage source 21. Meanwhile, the oscillator circuit 2 utilizes the input voltage and the current to stabilize the frequency of the generated sine wave. The stabilizing device 22 comprises a plurality of transmission gate to provide more resistance to downgrade the electric current generated by the voltage source 21. Since the electric current is reduced, the charging time will be extended and the frequency will not be raised. Comparators 23, 24 and 25 are coupled in series. The input terminal of the comparator 23 is coupled to the capacitor 26. The output terminal of the comparator 23 is coupled to the input terminal of the comparator 24. The output terminal of comparator 24 is coupled to the input terminal of the comparator 25, and the output terminal of the comparator 25 is coupled to the voltage source 21. Additionally, the oscillator 2 is, but not limited to, an RC oscillator.

The frequency of the sine wave generated by the oscillator 2 is determined by the input voltage. The frequency increases when the input voltage decreases. However, the frequency stabilizing device 22 keeps the frequency in constant when the input voltage decreases. This is caused by much more resistance provided by the frequency stabilizing device 22. The electric current generated by the voltage source 21 is reduced and the charging time is extended.

Figure 3:
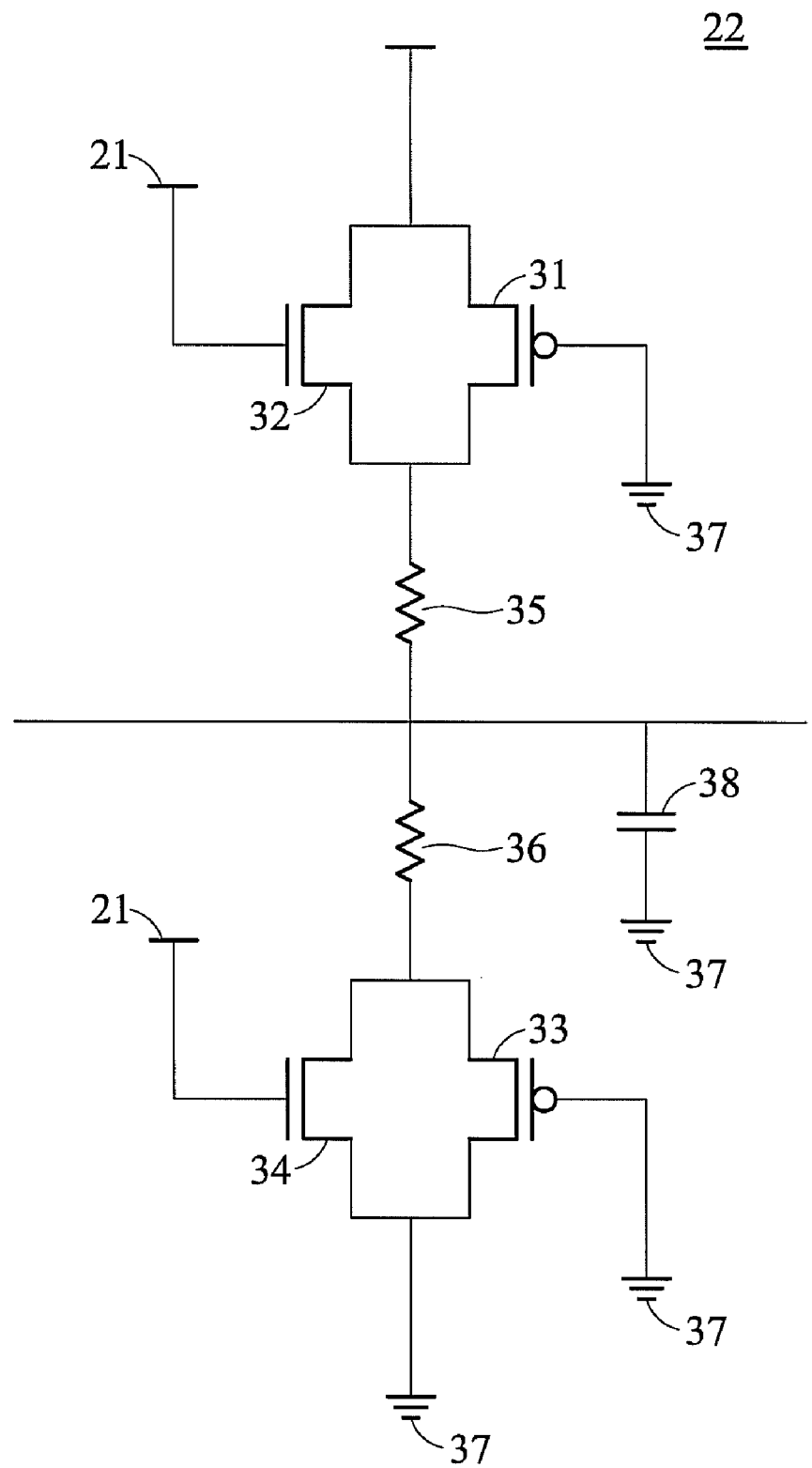
FIG. 3 illustrates the exemplary circuit of the frequency stabilizing device according a preferred embodiment of the invention.

Please refer to FIG. 3. FIG. 3 illustrates the circuit of the frequency stabilizing device according to a preferred embodiment of the invention. The frequency stabilizing device 22 comprises a first p-type metal-oxide-semiconductor (PMOS) 31, a first n-type metal-oxide-semiconductor (NMOS) 32, a second PMOS 33, a second NMOS 34, a first resistor 35, a second resistor 36, a ground terminal 37, and a voltage source 21. The voltage source 21 and the ground terminal 37 generate an input voltage. The gate terminal of the first NMOS 32 is coupled to the voltage source 21. Furthermore, the gate terminal of the first PMOS 31 is coupled to the ground terminal 37. The drain terminal of the first PMOS 31 and NMOS 32 are coupled to a terminal of the first resistor 35. The other terminal of the first resistor 35 is coupled to the second resistor 36 and a capacitor 38. The second resistor 36 is subsequently coupled to the source terminal of the second PMOS 33 and NMOS 34. Also, the gate terminal of the second NMOS 34 is coupled to the voltage source 21. The gate terminal of the second PMOS 33 and the drain terminal of the second PMOS 33 and NMOS 34 are then coupled to the ground terminal 37.

The frequency stabilizing device comprises a first transmission gate formed by the first PMOS 31 and the first NMOS 32 and a second transmission gate formed by the second PMOS 33 and the second NMOS 34. The input voltage generates a current through the two transmission gates. The current is positive in relation to the input voltage and controlled by the first resistor 35 and the second resistor 36. Further, the current determines the frequency of the sine wave generated by the oscillator circuit 2. When the input voltage decreases, in a normal situation, the frequency is expected to be increased. But since the two transmission gates of the frequency stabilizing device 22 and the resistors 35, 36 provide huge resistance, the current generated by voltage source 21 accordingly decreases in accordance with frequency characteristics. It causes the charging time (RC) of the transmission gates to be extended. Consequently, increase of the RC value results in decrease of the frequency.

Therefore, when the input voltage of the oscillator decreases, the frequency of the oscillator increases due to decrease of the input voltage. However, due to the current generated by the frequency stabilizing device, the frequency of the oscillator decreases. As such, the frequency stabilizing device maintains the frequency of the oscillator in constant independent of variations in the input voltage of the oscillator. Consequently, the described embodiments of the invention result in a substantial improvement in stabilizing the frequency of the oscillator.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency stabilizing device of an oscillator for stabilizing the frequency of an oscillator to keep the frequency in constant when an input voltage is changed, wherein the frequency stabilizing device of oscillator comprises:
   a plurality of gate elements comprising a plurality of metal-oxide-semiconductors (MOS);
   a plurality of voltage sources coupled to the plurality of gate elements as the input voltage of the plurality of gate elements; and
   a plurality of resistors coupled to the plurality of gate elements;
   wherein the gate elements coupled to the voltage source generate a current which flows though the gate elements and is proportional to the input voltage,
   the gate elements comprise a first transmission gate and a second transmission gate, and
   the resistors are two resistors, one terminal of a first resistor is directly connected to one terminal of a second resistor at a node which is coupled to an output terminal of the oscillator, the other terminal of the first resistor is coupled to a first terminal of the first transmission gate, and the other terminal of the second resistor is coupled to a first terminal of the second transmission gate.

2. The frequency stabilizing device of an oscillator as claimed in claim 1, wherein the oscillator is an RC oscillator.

3. The frequency stabilizing device of an oscillator as claimed in claim 1, wherein the first transmission gate and the second transmission gate comprise a p-type MOS (PMOS) and an N-type MOS (NMOS), respectively.

4. The frequency stabilizing device of an oscillator as claimed in claim 1, wherein the plurality of voltage sources are two voltage sources coupled to the gate elements to supply current to control the frequency of the oscillator.

5. The frequency stabilizing device of an oscillator as claimed in claim 1, wherein when the current decreases with the decrease of the input voltage, the frequency of the oscillator keeps in constant due to compensation for the effects of the decreased input voltage and the decreased current.

6. A frequency stabilizing device of an oscillator for stabilizing the frequency of an oscillator to keep the frequency in constant when an input voltage is changed, wherein the frequency stabilizing device of oscillator comprises:
   a plurality of transmission gates for receiving the input voltage to supply a current; and
   a plurality of resistors for controlling the value of the current;
   wherein the current flowing though the transmission gates is proportional to the input voltage and controls the frequency of the oscillator,
   the transmission gates comprise a first transmission gate and a second transmission gate, and
   the resistors are two resistors, one terminal of a first resistor is directly connected to one terminal of a second resistor at a node which is coupled to an output terminal of the oscillator, the other terminal of the first resistor is coupled to a first terminal of the first transmission gate, and the other terminal of the second resistor is coupled to a first terminal of the second transmission gate.

7. The frequency stabilizing device of an oscillator as claimed in claim 6, wherein the oscillator is an RC oscillator.

8. The frequency stabilizing device of an oscillator as claimed in claim 6, wherein the first transmission gate and the second transmission gate comprise a p-type MOS (PMOS) and an N-type MOS (NMOS), respectively.

9. The frequency stabilizing device of an oscillator as claimed in claim 6, wherein when the current decreases with the decrease of the input voltage, the frequency of the oscillator keeps in constant due to compensation for the effects of the decreased input voltage and the decreased current.

10. The frequency stabilizing device of an oscillator as claimed in claim 6, further comprising two voltage sources for providing the input voltage.

11. An oscillator comprising a frequency stabilizing device for stabilizing the frequency of an oscillator to keep the frequency in constant when an input voltage is changed, wherein the frequency stabilizing device comprises:
   a plurality of transmission gates for receiving the input voltage to supply a current; and
   a plurality of resistors for controlling the value of the current;
   wherein the current flowing though the transmission gates is proportional to the input voltage and controls the frequency of the oscillator,
   the transmission gates comprise a first transmission gate and a second transmission gate, and
   the resistors are two resistors, one terminal of a first resistor is directly connected to one terminal of a second resistor at a node which is coupled to an output terminal of the oscillator, the other terminal of the first resistor is coupled to a first terminal of the first transmission gate, and the other terminal of the second resistor is coupled to a first terminal of the second transmission gate.

12. The oscillator as claimed in claim 11, wherein the oscillator is an RC oscillator.

13. The oscillator as claimed in claim 11, wherein the first transmission gate and the second transmission gate comprise a p-type MOS (PMOS) and an n-type MOS (NMOS), respectively.

14. The oscillator as claimed in claim 11, wherein the plurality of resistors are two resistors, and one terminal of a first resistor is coupled to one terminal of a second resistor, and the other terminal of the first resistor coupled to a gate terminal of the PMOS or the NMOS of the transmission gates.

15. The oscillator as claimed in claim 11, wherein when the current decreases with the decrease of the input voltage, the frequency of the oscillator keeps in constant due to compensation for the effects of the decreased input voltage and the decreased current.

16. The oscillator as claimed in claim 11, further comprising two voltage sources for providing the input voltage.

\* \* \* \* \*